US007368324B2

(12) United States Patent
Weidner et al.

(10) Patent No.: US 7,368,324 B2
(45) Date of Patent: May 6, 2008

(54) METHOD OF MANUFACTURING SELF-SUPPORTING CONTACTING STRUCTURES

(75) Inventors: Karl Weidner, München (DE); Eckhard Wolfgang, München (DE); Jörg Zapf, München (DE)

(73) Assignee: Siemens Aktiengesellschaft, Munich (DE)

( * ) Notice: Subject to any disclaimer, the term of this patent is extended or adjusted under 35 U.S.C. 154(b) by 299 days.

(21) Appl. No.: 10/547,174

(22) PCT Filed: Jan. 15, 2004

(86) PCT No.: PCT/EP2004/000263

§ 371 (c)(1), (2), (4) Date: Aug. 26, 2005

(87) PCT Pub. No.: WO2004/077546

PCT Pub. Date: Sep. 10, 2004

(65) Prior Publication Data
US 2006/0248716 A1 Nov. 9, 2006

(30) Foreign Application Priority Data
Feb. 28, 2003 (DE) ............... 103 08 928

(51) Int. Cl.
*H01L 21/00* (2006.01)
(52) U.S. Cl. ............... 438/121; 257/E23.023
(58) Field of Classification Search ........ 438/124, 438/121, 125, 612; 29/840, 843
See application file for complete search history.

(56) References Cited

U.S. PATENT DOCUMENTS

| 5,291,066 A | | 3/1994 | Neugebauer et al. | |
| 5,353,498 A | * | 10/1994 | Fillion et al. | ............... 29/840 |
| 5,637,922 A | | 6/1997 | Fillion et al. | |
| 5,653,019 A | | 8/1997 | Bernhardt et al. | |
| 6,127,199 A | | 10/2000 | Inoue et al. | |
| 6,519,840 B1 | * | 2/2003 | Stalder | ............... 29/833 |
| 7,208,347 B2 | * | 4/2007 | Seliger et al. | ............... 438/124 |
| 2002/0039464 A1 | | 4/2002 | Yoshimura et al. | |
| 2003/0015774 A1 | | 1/2003 | Auburger et al. | |
| 2006/0252253 A1 | * | 11/2006 | Seliger et al. | ............... 438/625 |

FOREIGN PATENT DOCUMENTS

| DE | 91 09 295 U1 | 11/1991 |
| DE | 100 04 410 A1 | 8/2001 |
| WO | WO 95/09438 | 4/1995 |

OTHER PUBLICATIONS

Paavo Jalonen, "A new concept® for making fine line substrate for active component in polymer", Microelectronics Journal, Feb. 2003, pp. 99-107, vol. 34, No. 2, Mackintosh Publications Ltd., Luton, Germany.

* cited by examiner

*Primary Examiner*—Michael Lebentritt
*Assistant Examiner*—Reema Patel

(57) ABSTRACT

A self-supporting contacting structure is directly produced on a component that does not have a housing by applying a layer made of non conducting material and a layer made of an electrically conductive material to the component and to a support and by subsequently removing these layers from said support.

21 Claims, 5 Drawing Sheets

METHOD OF MANUFACTURING SELF-SUPPORTING CONTACTING STRUCTURES

CROSS REFERENCE TO RELATED APPLICATIONS

This application is the U.S. National Stage of International Application No. PCT/EP2004/000263, filed Jan. 15, 2004 and claims the benefit thereof. The International Application claims the benefits of German application No. 10308928.4, filed Feb. 28, 2003. The International Application and the German application are incorporated by reference herein in their entirety.

FIELD OF INVENTION

The invention relates to self-supporting contacting structures that are directly produced on components without housing.

BACKGROUND OF THE INVENTION

To get from contact pads of electronic components without housings to larger solderable contact elements, the use of a lead frame is known. The component to be contacted is in this case placed an a mostly metallic punched contacting support, known as the lead frame, and the contact pads of the components are electrically-connected through wire bonding with the individual leads of the contacting support.

A further method for contacting components without housings is to use what is known as the Tape Automated Bonding (TAB) technique. In this case flexible structures with narrow solderable internal contacts and wide solderable external contacts are produced, such structures being known as spiders. The contact pads of the component to be contacted are connected to the internal contacts. The external contacts are used for contacting with the circuit carrier.

SUMMARY OF THE INVENTION

Using these approaches as its starting point, an object of the present invention consists of specifying an alternative and low-cost option for contacting components without housings, which is especially also suitable for power components.

This object is achieved by the inventions specified in the claims.

The idea behind the invention is to create a self-supporting, planar, conductor and/or isolator structure initially on a support and then to detach it from this support.

Accordingly, in a method for fabricating a component with a contacting structure, a layer of electrically-isolating material is applied to the component and to a support arranged on and/or at the component. In this case the support in particular does not have to be covered over its whole surface by the layer of electrically-isolating material. An electrical contact surface of the component remains free when the layer of electrically-isolating material is applied and/or is revealed after the application of the layer of electrically-isolating material. Then, in a further step, a layer of electrically-conductive material is applied to the layer of electrically-isolating material and to the electrical contact surface of the component. Finally the layer of electrically-isolating material is detached from the support.

Naturally it lies within the framework of the invention to use this procedure in a similar manner for a number of components with contact surfaces, for modules with a number of components and/or for components with a number of contact surfaces.

The layer of electrically-conductive material can additionally also be applied to the area of the support which is not covered by-the layer of electrically-isolating material. Then finally, as well as the layer of electrically-isolating material, the layer of electrically-conductive material is also detached from the support.

As an alternative or in addition, a layer of electrically-isolating material is applied to the component in a method for fabricating a component with a contacting structure An electrical contact surface of the component remains free when the layer of electrically-isolating material is applied and/or is revealed after the application of the layer of electrically-isolating material. In a further step a layer of electrically-conductive material is applied to the layer of electrically-isolating material, the electrical contact surface of the component and to a support arranged on and/or at the component. In this case the support in particular does not have to be covered over its whole surface by the layer of electrically-conductive material. Finally the layer of electrically-isolating material is detached from the support.

The layer of isolating material and the layer of electrically-conductive material form a planar, self-supporting contacting structure in the form of a conductor/Isolator structure on the component.

For passivation to protect against environmental influences the component and the layer can thereafter be enclosed at least partly in a housing and/or covered by a cover. To this end for example the component, the layer of electrically-isolating material and/or the layer of electrically-conductive material are in particular encapsulated with each other. This can be done for example in the form of a drop passivation (Globtop) or a frame encapsulant (Silgel). Instead of Globtop or Overmold however, laminating on a further foil is also conceivable. As an alternative or in addition to a plastic covering in the form of a plastic foil or a Globtop a Nickel/Gold protective layer can also be used.

Preferably the support exhibits at least in part a low surface adhesion. In particular it is Teflon-coated and/or made of Teflon.

The support can also feature a holder for the component and/or an ejector for detaching the layer of electrically-conducting and/or the layer of electrically-isolating material.

Revealing the contact surface of the component preferably opens a window in the layer of electrically-isolating material with more than 60% of the size of the side and/or surface of the component, at which the window is opened, especially more than 80% This means that the method is especially suitable for power components, for which on contacting with a flat conductor a contact window and a contact surface of the appropriate size is provided. The window is especially opened on the largest and/or the side of the component facing away from the support and preferably has an absolute size of more as 50 mm$^2$, especially more than 70 mm$^2$ or even more than 100 mm$^2$.

As an alternative or in addition to revealing the contact surface of the component, the layer of electrically-isolating material can also be applied so that the contact surface of the component remains at least partly free, in that a window is opened with more than 60% of the size of the side and/or surface of the component, at which the window is opened, especially more than 80%.

To ensure clean coverage of the edges of the component, the size of the window should on the other hand not amount to more than 99.9% of the size of the side and/or surface of the component on which the window is opened, especially not more than 99% and further preferably not more than 95%.

The fact that the component is arranged on and/or at the support means that support and component form a surface contour. The layer of electrically-isolating material is especially applied to the support and the component such that the layer of electrically-isolating material follows the surface contour formed by support and component, i.e. that the layer of electrically-isolating material corresponding to the surface contour formed from support and component runs over the surface contour. If on the other hand logic chips are embedded in a polymer, as in the prior art, only the underside of the polymer layer follows the surface contour, but not the polymer layer itself.

The fact that the layer of electrically-isolating material follows the surface contour formed from support and component produces two advantages, especially if a power component is used as a component. On the one hand a still sufficient thickness of the layer of electrically-isolating material over the edges of the component facing away from the support is guaranteed so that a flashover at high voltage or field strengths is prevented. On the other hand the layer of electrically-isolating material alongside the as a rule very high power component is not so thick that a any later revealing and contacting of contact surfaces on conductor tracks of a substrate, on which the component is later to be arranged, would be problematic.

The thickness of the layer of electrically-isolating material over the support varies in an area running in a straight line by less than 50% of its thickness over the component and the linear area surrounding it, especially by less than 20%. Preferably the thicknesses are about the same, that is they vary by less than 5% or even less than 1% from one another. The percentage figures relate especially to the thickness of the layer over the component and the linear area surrounding it, which accordingly specifies the 100%. The area running linearly is taken into consideration since the layer is as a rule thicker in the inner edges of support and component and thinner over the edges of the component facing away from the support.

The layer of electrically-isolating material is especially made of plastic. Depending on further processing it can be photosensitive or non-photosensitive.

It is preferably applied using one or more of the following procedures: Curtain coating, dipping, especially single-side dipping, discharge coating, especially electrostatic discharge coating, printing, especially screen printing, overmolding, dispensing, spin coating, application of a laminate foil.

From time to time it is advantageous if the layer of electrically-isolating material is not a foil. If on the other hand a foil is used as the layer of electrically-isolating material, the lamination is advantageously undertaken in a vacuum press, Conceivable methods are vacuum swaging, hydraulic vacuum pressing, vacuum gas pressure pressing or similar lamination procedures. The pressure is advantageously applied isostatically. The lamination is undertaken for example at temperatures of 100° C. to 250° C. and a pressure of 1 bar to 10 bar. The precise process parameters of the application of the lamination, that is pressure, temperature, time etc., depend amongst other things on the topology of the component and of the support, of the plastic material of the foil and the thickness of the foil.

The foil can consist of any type of thermoplasts, duroplasts and mixtures thereof A foil made of a plastic material based on Polyimide (PI), Polyethylene (PE), Polyphenole, Polyether-Etherketone (PEEK) and/or epoxy are used in the inventive method. The foil can in this case feature an adhesive coating on the surface to improve adhesion. Likewise the substrate surface can be coated with an adhesion promoter, preferably Silane compounds.

After the application of the lamination a tempering stage is especially performed. The temperature treatment and moistening improve the adhesion, thermal, physical and mechanical properties of the foil on the surface.

To apply the layer of electrically-conducting material, that his for planar contacting, a physical chemical separation o f electrically-conducting material is advantageously undertaken. These types of physical procedure are sputtering and Physical Vapor Deposition, (PVD). The chemical separation can be undertaken in a gaseous phase (Chemical Vapor Deposition, CVD) and/or liquid phase: (Liquid Phase: Chemical Vapor Deposition). It is also conceivable that initially one of these procedures is used to apply a thin electrically-conductive sublayer, of titanium/copper for example onto which a thicker electrically-conductive sublayer of for example copper can be electrically deposited.

The layer of electrically-isolating material is in this case designed so that a height difference of up to 1000 μm can be overcome. The height difference is caused amongst other things by the topology of the support and of the semiconductor chip arranged on and/or at the support.

The thickness of the layer of electrically-isolating material can amount to between 10 μm and 500 μm. Preferably in the inventive method a layer of electrically-isolating material with a thickness of 25 to 150 μm is applied.

In a further embodiment the application is repeated as often as is required to achieve a specific thickness of the layer of electrically-isolating material. For example sublayers of electrically-isolating material of lesser thickness are processed to form one layer of electrically-isolating material of greater thickness. These sublayers of electrically-isolating material advantageously consist of a type of plastic material. It is also conceivable in this case that the sublayers of electrically-isolating material consist of a number of different plastic materials. The result is the layer of electrically-isolating material constructed from the sublayers.

The electrical contact surface of the component can be left free on application of the layer of electrically-isolating material and/or can be revealed later. The complete or partial revealing as the layer is being applied can be implemented especially advantageously if the layer of electrically-isolating material is applied in the form of a foil. This then namely allows a foil with one or more corresponding openings or windows to be used right from the start which can be created for example beforehand using a low-cost punching or cutting-out methods.

In a particular embodiment a window is opened in the layer of electrically-isolating material by laser ablation for revealing of the electrical contact surfaces. A wavelength of a laser used for this purpose amounts to between 0.1 μm and 11 μm. The power of the laser amounts to between 1 W and 100 W. Preferably a CO2 laser with a wavelength of 9,24 μm is used. The window is opened in this case without damaging any aluminum, gold or copper chip contacts which might lie below the layer of electrically-isolating material.

In a further embodiment a photo-sensitive layer of electrically-isolating material is used and a window is opened using a photo-lithographic process to reveal the electrical contact surface. The photo-lithographic process comprises exposing the photo-sensitive layer of electrically-isolating material and developing and thereby removing the exposed or non-exposed areas of the layer of electrically-isolating material.

After the window is opened there may be a cleaning step in which the remains of the layer of electrically-isolating material are removed. The cleaning step is undertaken for example using wet chemistry. A plasma cleaning method is especially conceivable.

In a further embodiment a layer comprising a number of sublayers of different electrically-conducting materials arranged above one another is used. For example different metal layers are applied above one another. The number of the sublayers or metal layers especially amounts to between 2 and 5. A sublayer functioning for example as a diffusion barrier can be integrated by the layer constructed from a number of sublayers. Such a sublayer consists for example of a titanium-tungsten alloy (TiW). Advantageously, with a multi-layer construction, a sublayer which promotes adhesion or improves it is applied directly to the surface to be contacted. Such a sublayer consists of titanium for example.

In a particular embodiment, after the planar contacting at least one conductor track is created in and/or on the layer of the electrically-conducting material. The conductor track can be applied to the layer. In particular a structuring of the layer is performed to create the conductor track. This means that the conductor track is created in this layer. The conductor track is used for example for the electrical contacting of a semiconductor chip.

The track is usually structured in a photo-lithographic process. To this end a photo resist can be applied to the electrically-conducting layer, dried and subsequently exposed and developed. Under some circumstances a tempering step follows in order to stabilize the photo resist which has been applied against subsequent treatment processes. Conventional positive and negative resists (coating materials) may be used as photo resists. The photo resist is for example applied using a deposition or dipping process. Electro-deposition (electrostatic or electrophoretic deposition) is also conceivable.

Instead of a photo resist, another material able to be structured can be applied with one or more of the following procedures: Curtain coating, dipping, especially single-side dipping, discharge coating, especially electrostatic discharge coating, printing, especially screen printing, overmolding, dispensing, spin coating, application of a laminate foil.

Photo-sensitive foils can also be used for structuring, said foils being applied as a laminate and exposed and developed in a comparable way to the applied photo resist layer.

To create the conductor track the process employed can be as follows for example: In a first part step the electrically-conducting layer is structured and in a subsequent part step a further metallization is applied to the conductor track created. The conductor track is strengthened through the further metallization. For example copper is electrically-deposited to a thickness of 1 μm to 400 μm on the conductor track created by the structuring. Thereafter the photo resist layer or the laminated-on foil or the alternatively used structurable material is removed. This is undertaken for example with an organic solvent, an alkaline developer or suchlike. Through subsequent differential etching the surface metallic conducting layer not strengthened by the metallization is removed again. The strengthened conductor track is retained.

In a particular embodiment, for manufacturing a multi-layer device, the steps of lamination application, revealing, contacting and creating the conductor track are performed a number of times.

The invention advantageously provides an innovative technology for electrical contacting and wiring of connection pads or contact surfaces which are arranged on a semiconductor chips, especially on power semiconductor chips. In addition, with the inventive method the planar connection and the particular isolation produces a low-induction connection to allow fast and low-loss switching.

Application of the layer of electrically-isolating material produces an electrical isolation layer. The manufacturing of the isolation layer by the inventive application of the layer of electrically-isolating material provides the following advantages:

use at high temperatures. A layer of electrically-isolating material is, with a suitable choice of materials, heat-resistant up to 300° C.

Low process costs.

High isolation field strengths are possible by using thicker layers of insulation.

Higher throughput. e.g. can be processed in wafers.

Homogeneous insulation characteristics since entry of air is prevented by processing the layer of electrically-isolating material in a vacuum.

The entire chip contact surface can be used so that high currents can be discharged.

The flat contacting allows the chips to be activated homogeneously.

The inductance of the contact with one contact surface is smaller than with thick wire bonding because of the flat geometry.

The contacting leads to higher reliability for the vibration and mechanical shock stresses.

Higher stability from changes in load of compared to competing methods because of lower thermo-mechanical voltages.

A number of wiring planes are accessible.

The planar connection technology described only demands a small component height. The result is a more compact design.—With multi-layer connection planes wide-area metallization layers are implemented for screening. This has a very positive effect in particular on the EMC (Electromagnetic Compatibility) behavior of the circuit (noise emissions, noise immunity).

Preferred and advantageous embodiments of the device are produced from the preferred embodiments of the method.

BRIEF DESCRIPTION OF THE DRAWINGS

Further features and advantages of the invention are produced from the description of exemplary embodiments with reference to the drawing. The Figures show.

DETAILED DESCRIPTION OF THE INVENTION

Figure 1:
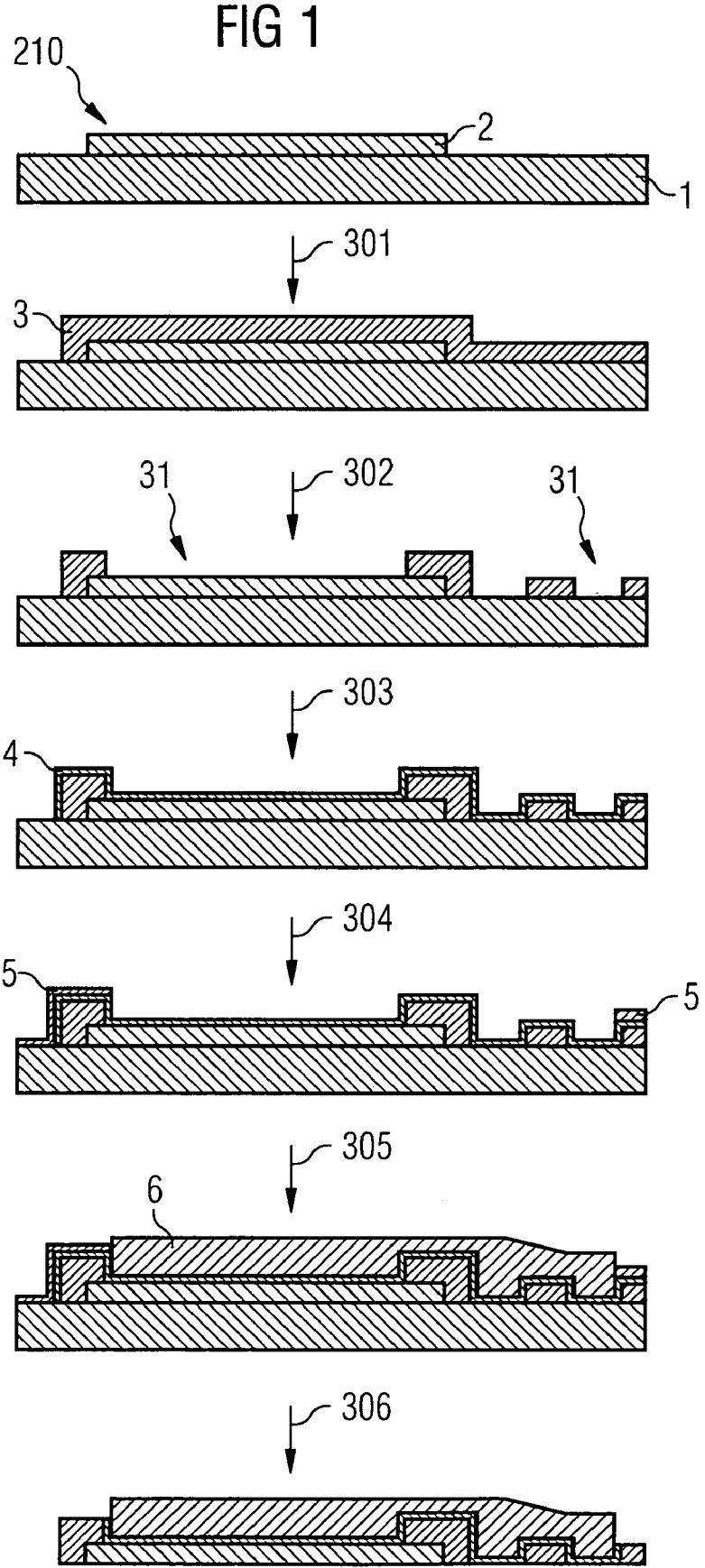
FIG. 1 A method for creating a contacting structure on a power semiconductor.

FIG. 1 shows a support 1 made of Teflon on which a component 2 in the form of a semiconductor chip is arranged.

On the upper surface of the semiconductor chip 2 there is a contact with a contact surface 210 it facing away from the semiconductor chip 2.

If for example the semiconductor chip 2 is a transistor, the contact surface is the contact surface of a collector or drain contact or of an emitter or source contact.

The entire upper surface of the support equipped with a the semiconductor chip 2 is formed by the surface of the support 1 itself and by the free surface of the semiconductor chip 2 which is defined by the upper surface and the side surface of this chip 2.

In step 301 a layer 3 of electrically-isolating plastic material is applied in a vacuum to the entire surface of the support equipped with the semiconductor chip 2, so that the layer of electrically-isolating material provides close coverage of the surface of the support 1 equipped with the semiconductor chip 2 with the contact surfaces and adheres to this surface. The layer 3 of electrically-isolating material in this case follows the surface contours produced by the exposed parts of the surface of the carrier and by the free surface of the semiconductor chip 2 which is determined by the upper surface and the side surface of this chip 2.

The application of the layer 3 of electrically-isolating material in step 301 is preferably undertaken with one or more of the following processes: Curtain coating, dipping, especially single-side dipping, discharge coating, especially electrostatic discharge coating, printing, especially screen printing, overmolding, dispensing, spin coating.

The layer 3 of electrically-isolating material can also be applied particularly well by laminating on a foil, especially a foil made of a Polyimide or epoxy-based plastic material. There can be a subsequent tempering step for better adhesion.

The layer of electrically-isolating material is used as an insulator and as a support or for a further layer 4 comprising electrically-conductive material applied thereafter.

Typical thickness of the layer of electrically-isolating material lie in the range of 25-150 µm, with greater thicknesses being able to be obtained from sequences of layers of thinner sublayers of electrically-isolating material. This advantageously allows insulation field strengths in the range of a few 10 kV/mm to be implemented.

Now in step 302 the contact surface 210 of the component to be contacted is revealed by opening a window 31 in the layer of electrically-isolating material.

In addition areas of the support 1 are revealed by opening a relevant window 31 in the layer of electrically-isolating material.

The size of the window which is opened for contacting the contact surface (210) of the component amounts to more than 60% of the size of the component. especially to more than 80%

One of the windows 31 in the layer of electrically-isolating material is preferably opened by laser ablation.

Subsequently, in step 303, the revealed contact surface 210 of the component and each revealed surface on the support 1 is contacted with a layer 4 of electrically-conductive material, preferably metal, over its surface, in that the revealed contact surface and the revealed areas of the support 1 are metalized and thereby planar contacted with the usual methods.

For example the layer 4 of electrically-conductive material can be applied over the entire surface of both each contact surface and also to the upper surface of layer 3 facing away from the support 1 and then for example structured photo-lithographcally so that each contact surface remains fully contacted and conductor tracks 4,6 of insolating material are produced running over the contact surface of the revealed areas of the support 1 and the layer 3.

Preferably the following process steps (semi-additive construction) are performed to do this:

i). Sputtering of a Ti adhesion layer of appr. 100 nm thickness and of a Cu conducting layer 4 of appr. 200 nm thickness (step 303).

ii). Photo-lithography using thicker resist layers or photo foils 5 (step 304).

iii). Electrical strengthening of the revealed areas with an electrically-conducting layer 6 of greater strength. Layer thicknesses of up to 500 µm are possible here (step 305).

iv). Resist coating and differential etching of Cu and Ti as well as removal of the support (step 306).

Another process that can be used is to apply a mask to the upper surface of the layer of electrically-isolating material facing away from the surface of the substrate 1 which leaves the contact surface as well as areas free for the conductor tracks 4, 6 running over the contact surface of the revealed areas of the support 1 and the layer 3 of isolating material, and that then the layer 4 of electrically-conducting material is applied over the entire surface of the mask and the contact surfaces 210 and 112 as well as the areas free from the mask. Thereafter the mask is removed along with the layer 4 on it, so that only the planar-contacted contact surface 210 and the conductor tracks 4,6 running over the contact surface of the revealed areas of the support 1 and the layer 3 of isolating material on the mask-free areas are left.

In any event a device is provided thereafter consisting of a component 2 with a surface on which electrical contact surfaces 210 are arranged, in which an insulator in the form of a layer of electrically-isolating material is applied to a surface which is close to the surface and adheres to the surface and in which the layer of electrically-isolating material in the contact surface features a window 31 in each case, in which this contact surface is free of the layer 3 of electrically isolating material and is in planar contact with a layer 4 and for example additionally-with of a layer 6 of electrically-conducting material. Special embodiments of this device are produced by the present description.

Figure 2:
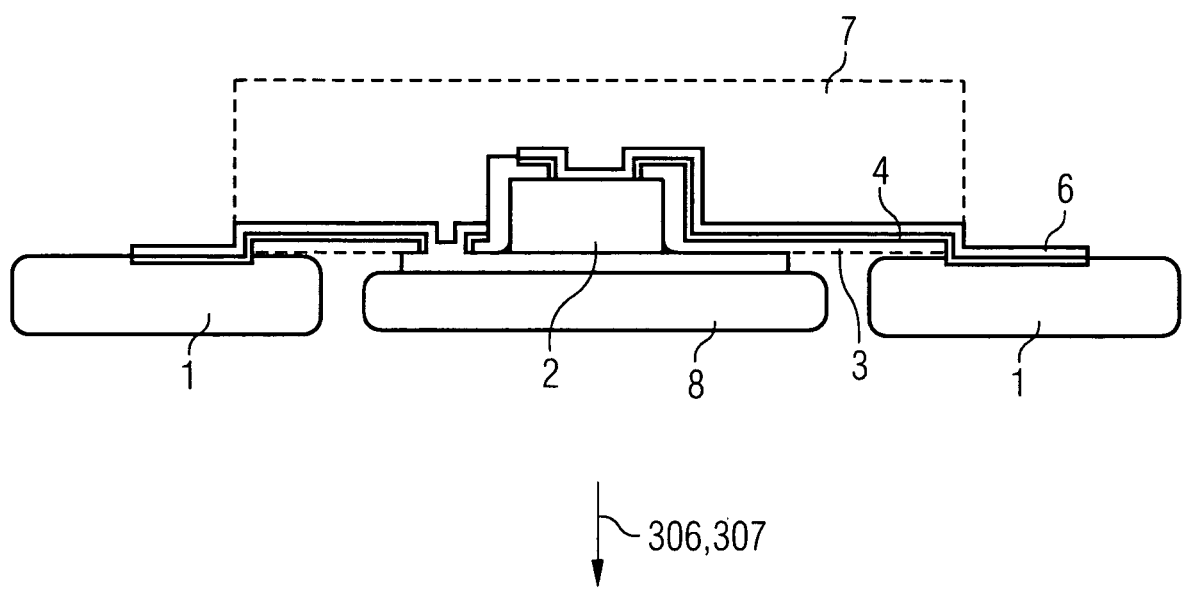
FIG. 2 An alternative component with self-supporting contacting structures, while it is still arranged on a support.

The device shown in FIG. 2 is produced using a similar production method as that shown in FIG. 1. The self-supporting contacting structures 3, 4, 6 of the component 2 are fabricated in this case with the following process steps:

Placing the component 2, which can also exist in the form of a module, on one or more suitably formed supports 1 coated with Teflon or similar plastics.

Laminating a layer of electrically-isolating material in the form of a plastic foil in a vacuum under pressure and temperature over component 2 and support 1.

Partial removal of the layer 3 of electrically-isolating material in the form of a plastic foil inter alia at the contact surface in the form of connection pads of the component 2 through laser ablation.

Application of a layer 4 of electrically-conductive material in the form of a thin, adhesive metallization, for example a Titanium adhesive layer, especially through sputtering or vapor deposition.

Application and structuring of a resist, for example through spin coating, resist deposition, electrophoretic resist application and subsequent photo lithography or through a printing process.

Electrical strengthening of the revealed metal structures of the layer 4 of electrically-conductive material with an electrically-conductive copper layer 6 of greater strength with an optional subsequent Nickel-Gold covering.

Possible covering of the component 2 by a second foil with subsequent partial laser ablation or by a plastic covering 7 in the overmold process o r as Globtop.

Detaching the component 2 and the metal/plastic contacting structures 3, 4, 6 produced from the support 1.

Possible partial etching away of the adhesion layer 4 from the metal structures 6, in order to achieve good solderability.

Possible formation of the self-supporting metal/plastic contacting structures 3, 4, 6 produced.

The contacting structure (connection contact structure) are thus created directly on the component 2 in this case. This means that the connection system, that is the soldering or wire bonding between the component and the contact element in the form of a lead frame or spider known from the prior art, is dispensed with. The conductor track 4, 6 created in this case for direct electrical connection in the form of a copper foil is low-induction, suitable for high currents and low-cost. Over and above this the technology has a very low component height compared to bond connection, since the bond loop is dispensed with. The technology can also be used for fabricating connection structures of components in the form of modules containing a number of individual components.

As can be seen from FIG. 2 the component 2 is arranged on a copper layer on a means 8 for dissipating heat (heat sink) while the self-supporting contacting structures 3, 4,6 are being fabricated. The component 2 and the means 8 for heat dissipation are in this case surrounded by supports 1 which are arranged to the left and to the right of component 2 and the means 8 for heat dissipation. Instead of two supports 1 two part-supports of the same support can be employed. In particular, when contacting structures are to be created which are to make the component 2 contactable all the way round, that is on all four sides, the part-supports can belong to the same support which extends around the component in the form of a support plate, said component being arranged in a cut-out of the support plate.

In step 306 the component 2 with the self-supporting contact structures 3, 4, 6 and the plastic covering 7 is removed from the support 1 and in step up the 307 is installed at its intended location.

Figure 3:
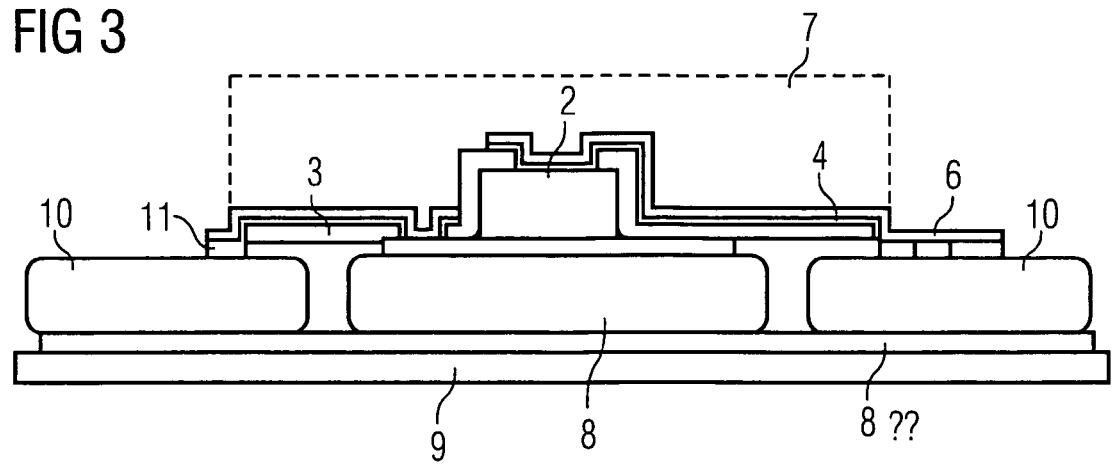
FIG. 3 The component according to FIG. 2 with self-supporting contacting structures after it has been detached from the support and is soldered into its intended location, in cross section.
Figure 4:
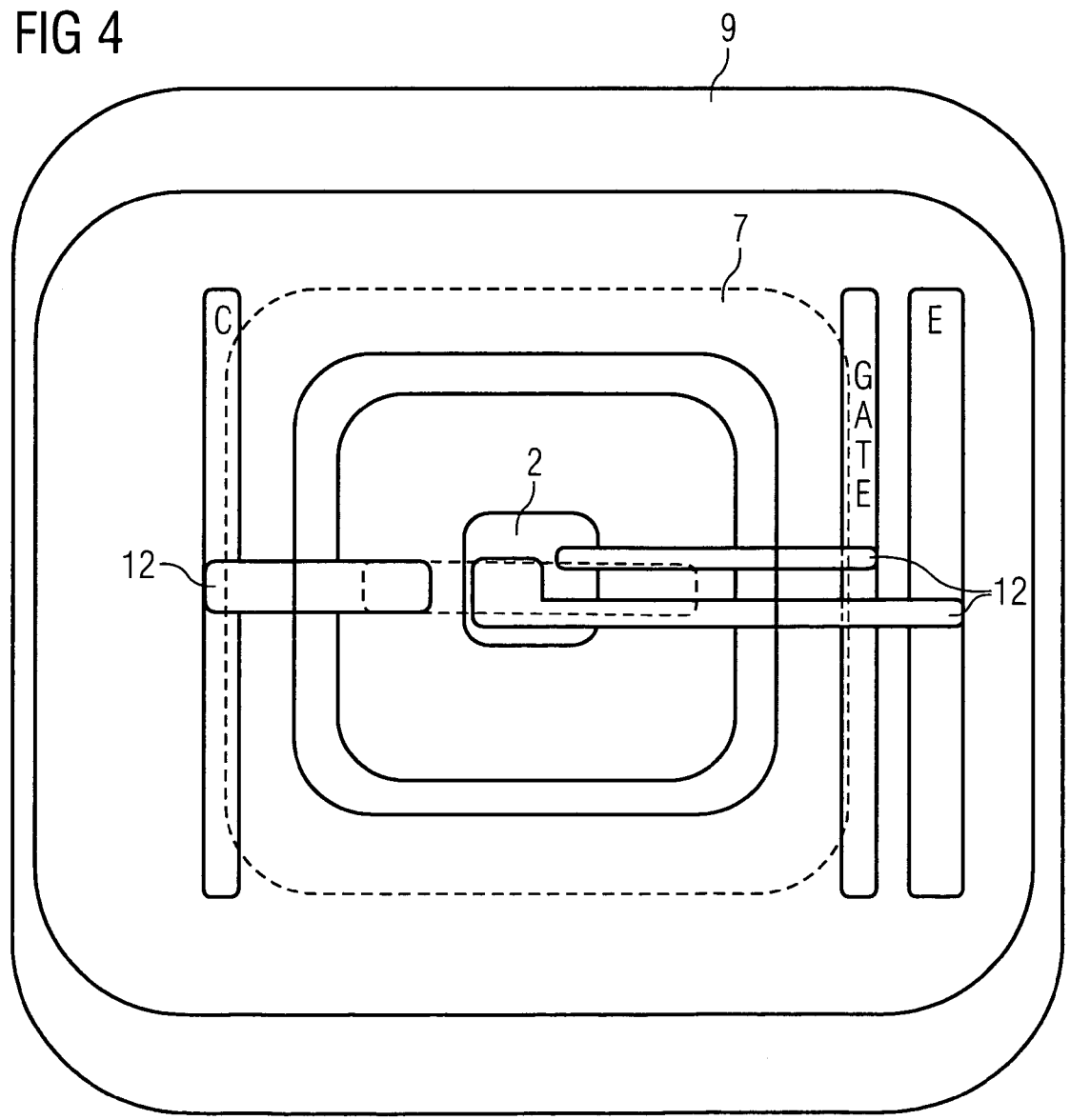
FIG. 4 The component in accordance with FIG. 2 with self-supporting contacting structures after it is released from the support and soldered into its intended location, viewed from above.

To this end, as is shown in cross section in FIG. 3 and in a view from above in FIG. 4, the component 2 is glued via its means 8 for heat dissipation using a heat-conducting adhesive 8 or this type of foil, to the metal housing 9. The electrically-conducting copper layer 6 of greater strength is connected to contact surfaces on which it has been freed from the layer 4 of electrically-conducting material in the form of an adhesive layer, with conductor tracks 11 of a circuit board, especially a PCB circuit board. This is done using solder connections 12. In the exemplary embodiment shown the component 2 is a power transistor and accordingly conductor track 11 for the collector C, the gate GATE and the emitter E of the transistor are present on the circuit board 10 with which this is connected.

Figure 5:
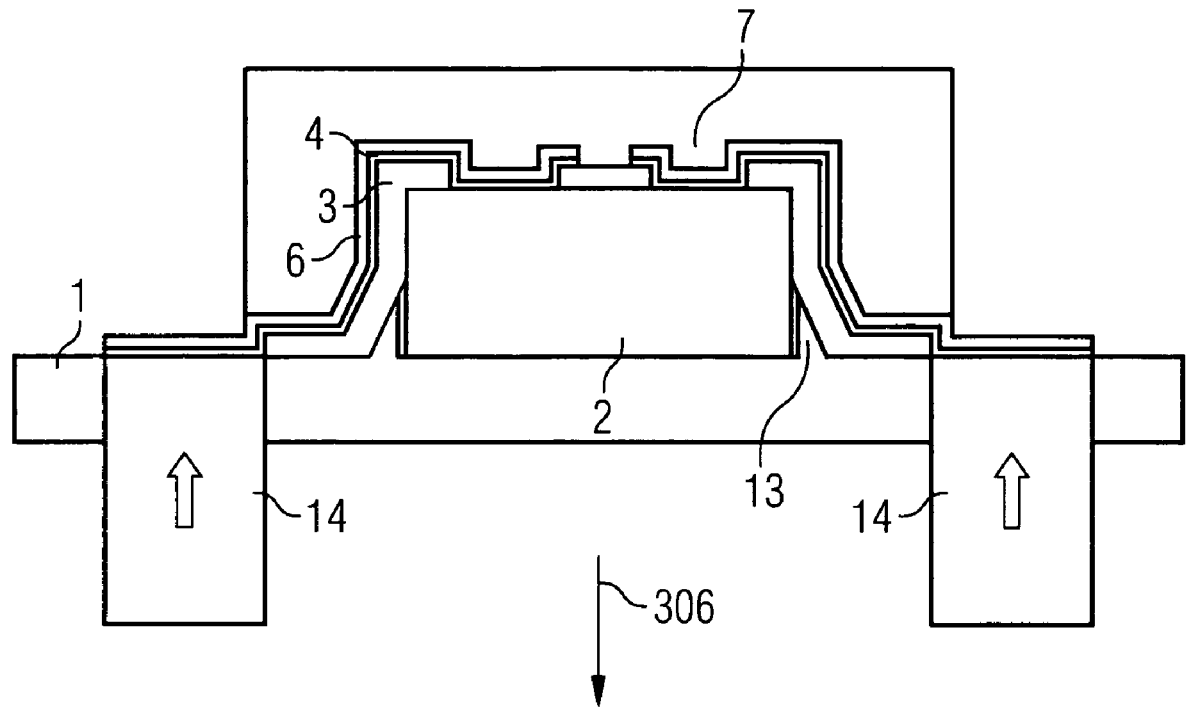
FIG. 5 A further alternative component with self-supporting contacting structures while it is still arranged on a carrier.

The exemplary embodiment in accordance with FIG. 5 differs from the embodiment shown in FIG. 2 in that the component 2 is not arranged at the support 1 but on it. In addition the support 1 is specially embodied in two respects. On the one hand it has a holder 13 in which the component 2 is securely held during the fabrication process. On the other hand ejectors 14 are arranged in the support which can be moved out of the support, and when the component 2 with the self-supporting contacting structures 3, 4, 6, that is the possibly still partially-present layers of electrically-isolating material and the conductor tracks 4, 6 of the layer 4 of electrically-conductive material and the electrically-conducting layer 6 of greater strength and with the cover 7 in the form of a Globtop are ejected.

Step 306 comprises in addition to the detachment in the form of ejection, also etching, especially etching away, of the layer 4 of electrically-conductive material formed by a titanium adhesion layer at the points at which the electrically-conducting copper layer 6 of greater strength is to be a subsequently soldered.

Figure 6:
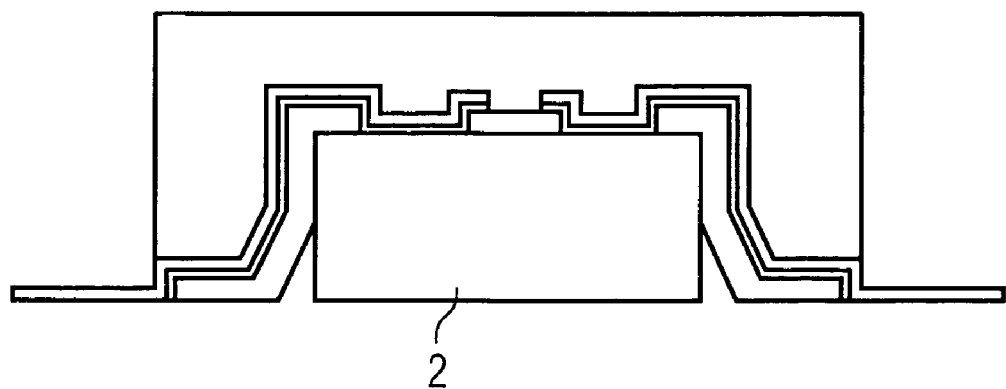
FIG. 6 The component in accordance with FIG. 5 with self-supporting contacting structures after it is detached from the support.

In FIG. 6 this component 2 with the self-supporting contacting structures and the cover is depicted in a detailed, handleable state. The conductor tracks 4, 6 of the self-supporting contacting structures 3, 4, 6 exhibit through their fabrication process the form of a copper foil and of therefore especially low-inductance and suitable for high currents.

Figure 7:
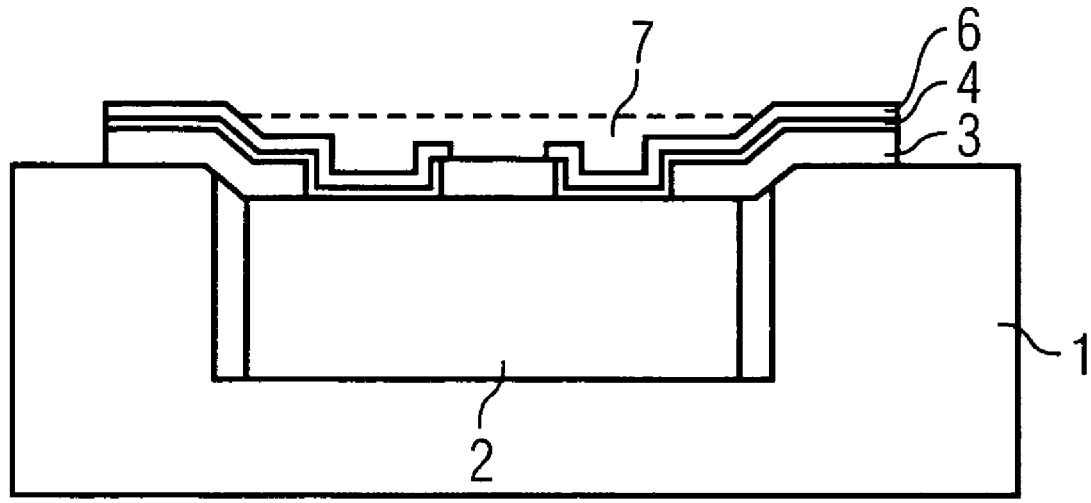
FIG. 7 Another alternative component with self-supporting contacting structures, while it is arranged on a support for fabrication.
Figure 8:
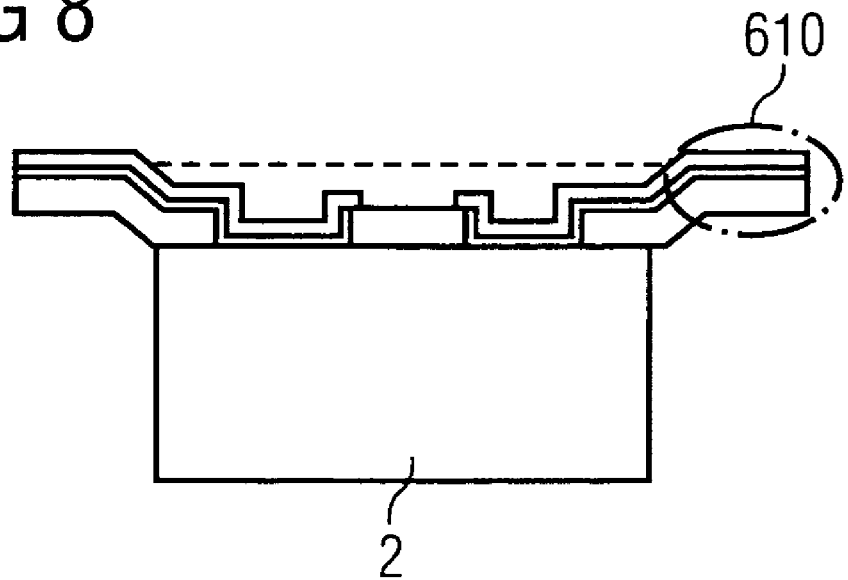
FIG. 8 The component in accordance with FIG. 7 with supporting contacting structures after it is detached from the support.

The exemplary embodiment shown in FIGS. 7 and 8 differs from that shown in FIGS. 5 and 6 in that the component 2 in the form of a chip is not arranged in the holder of the support but in a recess of the support 1, of which the depth corresponds approximately to the height of the component and of which the dimensions at right angles to its depth approximately correspond to the dimensions of the component at right angles to its height. In this way the contacting structure 3, 4, 6 fabricated on the component 2 is not brought down to the side of the component 2 located at the bottom during the fabrication but remains at around the same level or above the level of the upper side of the component 2 during fabrication. The advantage of this is that the extra-strength electrically-conducting layer 6 to be contacted does not first have to be-freed from the adhesive layer or the foil since its blank surfaces pointing upwards during fabrication can be directly used for soldering, in that the component 2 with its side which is at the top during fabrication pointing to a substrate can be assigned to the latter. To this end, as also applies in the other exemplary embodiments, the contact surface 610, that is the solderable leads, of the extra-strength electrically-conductive layer 6 are correctly placed on and soldered to the conductor track 4, 6 with methods known from SMD technology. Heat and pressure type soldering can however also be used on the equipped PCB circuit board, as with TAB.

The invention claimed is:

1. A method of manufacturing an electrical component having a contact structure, the component comprising:
   at least one electrical contact surface and multiple side surfaces generally oriented at right angles to the contact surface and of dimensions corresponding to a height of the component; and
   at least one contacting structure for electrically contacting the contact surface, the method comprising:
      providing a support having a first surface along which a recess is formed therein, the recess having a depth approximately corresponding to the height of the component;

positioning the component in the recess of the support with the sides extending into the recess so that the contact surface is at a level at or below that of the first surface;

attaching at least one contiguous isolating layer of electrically isolating material to the component and to the support such that the contact surface remains at least partly free of isolating material, the isolating layer extending directly from the contact surface to the first surface instead of extending in a path along the contact surface and then along one of the side surfaces in order to extend along the first surface;

manufacturing the contacting structure by applying a conducting layer of electrically conductive material onto the isolating layer and the contact surface such that the conducting layer does not extend along the sides of the component; and detaching the contacting structure, including the isolating layer, from the support, wherein: (i) applying the conducting layer includes arranging at least two component part conductive layers having different electrically conductive materials one above the other, and (ii) after detaching the contacting structure the conducting layer extends outward from the contacting surface and beyond at least one of the sides.

2. The method according to claim 1, wherein arranging at least one of the part conducting layers includes electroplating electrically conductive material.

3. The method according to claim 2, wherein an upper part conducting layer is arranged by electroplating.

4. The method according to claim 1, wherein attaching the isolating layer includes applying the electrically isolating material to the component and removing the electrically isolating material such that the contact surface is set free.

5. The method according to claim 1, wherein the support has at least on part of its surface a lower surface adhesion than the component.

6. The method according to claim 5, wherein the support is Teflon™ coated or made from Teflon™ such that the lower surface adhesion results.

7. The method according to claim 1, wherein the support comprises a fixture for the component.

8. The method according to claim 1, wherein the support comprises an ejector for detaching the isolating layer from the support.

9. The method according to claim 1, wherein attaching the isolating layer results in a free conduct surface comprising at least 60% of an extent of the component.

10. The method according to claim 9, wherein the free conduct surface comprises at least 80% of the extent of the component.

11. The method according to claim 9, wherein the free conduct surface comprises not more than 95% of the extent of the component.

12. The method according to claim 1, wherein attaching the isolating layer includes applying the electrically isolating material by an applying method chosen from the group consisting of curtain coating, dipping, discharge coating, printing, overmolding, dispensing, spin coating, and laminating a foil.

13. The method according to claim 12, wherein attaching the isolating layer includes laminating a foil and the foil is based on a plastic material chosen from the group consisting of Polyimide, Polyethylene, Polyphenol, Polyether Etherketone, and epoxy.

14. The method according to claim 12, wherein attaching the isolating layer includes laminating a foil, and after laminating the foil, adding a temper step.

15. The method according to claim 1, wherein the isolating layer has a thickness of 25 to 150 µm.

16. The method according to claim 1, wherein the component is a power semiconductor.

17. The method according to claim 1, wherein the component has a thickness of at least 70µm.

18. The method according to claim 1, wherein the thickness of the component is at least 100 µm.

19. The method according to claim 1, wherein the component forms a surface contour, and the isolating layer is applied to the component such that the isolating layer follows the surface contour.

20. The method according to claim 4, wherein removing the electrically isolating material includes laser ablation.

21. The method according to claim 4, wherein the electrically isolating material is photosensitive, and removing the electrically isolating material includes a photolithographic process.

* * * * *